United States Patent
Durach et al.

(10) Patent No.: US 11,621,378 B2
(45) Date of Patent: Apr. 4, 2023

(54) OPTOELECTRONIC COMPONENT

(71) Applicant: OSRAM Opto Semiconductors GmbH, Regensburg (DE)

(72) Inventors: Dajana Durach, Starnberg (DE); Kathy Schmidtke, Mainburg (DE)

(73) Assignee: OSRAM OLED GmbH, Regensburg (DE)

( * ) Notice: Subject to any disclaimer, the term of this patent is extended or adjusted under 35 U.S.C. 154(b) by 294 days.

(21) Appl. No.: 16/355,895

(22) Filed: Mar. 18, 2019

(65) Prior Publication Data

US 2019/0296197 A1    Sep. 26, 2019

(30) Foreign Application Priority Data

Mar. 20, 2018   (DE) ..................... 10 2018 106 465.9

(51) Int. Cl.
*H01L 33/50* (2010.01)
*C09K 11/88* (2006.01)

(52) U.S. Cl.
CPC .......... *H01L 33/504* (2013.01); *C09K 11/883* (2013.01)

(58) Field of Classification Search
CPC ............................ H01L 33/504; C09K 11/883
See application file for complete search history.

(56) References Cited

U.S. PATENT DOCUMENTS

| | | |
|---|---|---|
| 2014/0239335 A1 | 8/2014 | Goto |
| 2014/0246689 A1* | 9/2014 | Luo ....................... H01L 33/504 257/98 |
| 2014/0339495 A1* | 11/2014 | Bibi ....................... H01L 27/156 257/13 |
| 2015/0053914 A1* | 2/2015 | Kurtin ................... H01L 33/502 257/13 |
| 2015/0311406 A1* | 10/2015 | Lange ................. H01L 25/0753 257/89 |
| 2015/0340547 A1 | 11/2015 | Tamaki |
| 2015/0353740 A1* | 12/2015 | Kojima ................... C09D 5/004 362/296.04 |

(Continued)

FOREIGN PATENT DOCUMENTS

| | | |
|---|---|---|
| DE | 60 2004 006 610 T2 | 2/2008 |
| DE | 10 2012 104 363 A1 | 11/2013 |
| JP | 2017-215554 A | 12/1917 |

(Continued)

OTHER PUBLICATIONS

Notice of Reasons for Rejection dated Feb. 7, 2023, of counterpart Japanese Patent Application No. 2019-051677, along with a summary in English.

*Primary Examiner* — Christine A Enad
(74) *Attorney, Agent, or Firm* — DLA Piper LLP (US)

(57) ABSTRACT

An optoelectronic component includes an optoelectronic semiconductor chip that, during intended operation, generates primary radiation coupled out of the semiconductor chip via an emission side of the semiconductor chip; and a first conversion element on the emission side, wherein the first conversion element includes a first matrix material and first phosphor particles in the form of quantum dots, the first phosphor particles are distributed and embedded in the first matrix material, and the first matrix material is formed by a polysiloxane in which an atomic percentage of carbon is smaller than an atomic percentage of oxygen.

9 Claims, 2 Drawing Sheets

(56) References Cited

U.S. PATENT DOCUMENTS

2015/0361280 A1* 12/2015 Reynolds ............. C09D 5/1675
                                                                                                  424/405
2018/0046080 A1* 2/2018 Suzuki .................. C09K 11/08

FOREIGN PATENT DOCUMENTS

| JP | 2013-161862 A | 8/2013 |
| JP | 2016-001735 A | 1/2016 |
| WO | 2013/047407 A1 | 4/2013 |

* cited by examiner

OPTOELECTRONIC COMPONENT

TECHNICAL FIELD

This disclosure relates to an optoelectronic component.

BACKGROUND

There is a need for an optoelectronic component with a long service life.

SUMMARY

We provide an optoelectronic component including an optoelectronic semiconductor chip that, during intended operation, generates primary radiation coupled out of the semiconductor chip via an emission side of the semiconductor chip; and a first conversion element on the emission side, wherein the first conversion element includes a first matrix material and first phosphor particles in the form of quantum dots, the first phosphor particles are distributed and embedded in the first matrix material, and the first matrix material is formed by a polysiloxane in which an atomic percentage of carbon is smaller than an atomic percentage of oxygen.

Figure 1:
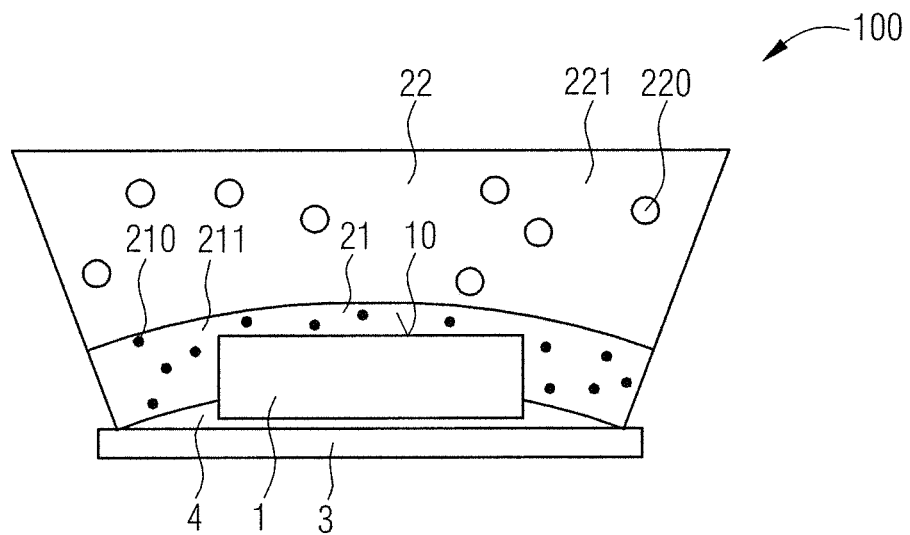
FIGS. 1 to 3 show different examples of an optoelectronic component in cross-sectional view.

REFERENCE SIGN LIST 1 optoelectronic semiconductor chip
3 carrier
4 reflective material
10 emission side
21 first conversion element
22 second conversion element
100 optoelectronic component
210 first phosphor particles
211 first matrix material
220 second phosphor particles
221 second matrix material

DETAILED DESCRIPTION

Our optoelectronic component comprises an optoelectronic semiconductor chip that generates primary radiation during intended operation, and is coupled out from the semiconductor chip via an emission side of the semiconductor chip.

The optoelectronic semiconductor chip comprises a semiconductor layer sequence with an active layer that generates electromagnetic radiation. The semiconductor layer sequence, for example, is based on a III-V compound semiconductor material. For example, the semiconductor material is a nitride compound semiconductor material such as $Al_nIn_{1-n-m}Ga_mN$, or a phosphide compound semiconductor material such as $Al_nIn_{1-n-m}Ga_mP$, or an arsenide compound semiconductor material such as $Al_nIn_{1-n-m}Ga_mAs$ or $Al_nIn_{1-n-m}Ga_mAsP$, wherein $0 \leq n \leq 1$, $0 \leq m \leq 1$ and $m+n \leq 1$, respectively. The semiconductor layer sequence may comprise dopants as well as additional components. For the sake of simplicity, however, only the essential components of the crystal lattice of the semiconductor layer sequence, i.e., Al, As, Ga, In, N or P, are given, even if they may be partially replaced and/or supplemented by small quantities of other substances. The semiconductor layer sequence is preferably based on AlInGaN or InGaN.

The active layer of the semiconductor layer sequence contains in particular at least one pn junction and/or at least one quantum well structure and can, for example, generate electromagnetic primary radiation in the blue or green or red spectral range or in the UV range during intended operation. The semiconductor chip preferentially comprises one active layer, in particular exactly one contiguous, particularly simply-connected single layer. Alternatively, the active layer can also be segmented.

A semiconductor chip is created by separation from a wafer composite. In particular, side surfaces of a semiconductor chip comprise traces from the separation process of the wafer composite. A semiconductor chip preferably comprises exactly one originally contiguous regions of the semiconductor layer sequence grown in the wafer composite. The semiconductor layer sequence of the semiconductor chip is preferably formed contiguously. For example, the lateral expansion of the semiconductor chip measured parallel to the main extension plane of the active layer is not more than 1% or not more than 5% greater than the lateral expansion of the active layer or the semiconductor layer sequence. The semiconductor chip, for example, also comprises the growth substrate on which the entire semiconductor layer sequence has grown.

The semiconductor chip can be a so-called volume emitter, in particular a flip chip. In this example, the semiconductor chip also preferentially comprises the growth substrate formed from sapphire, for example. Alternatively, the semiconductor chip can also be a surface emitter, in particular a so-called thin-film chip. In this example, the growth substrate is detached.

The emission side of the semiconductor chip is preferably a main side of the semiconductor chip, i.e., a side with the largest lateral expansion. The emission side preferably runs parallel to a main extension plane of the semiconductor chip. For example, at least 50% or at least 75% of the primary radiation coupled out from the semiconductor chip during operation is coupled out via the emission side.

The optoelectronic component may comprise a first conversion element on the emission side. The first conversion element may partially or completely cover the emission side. The first conversion element can be contiguous, in particular simply-connected. For example, the first conversion element is sprayed onto the semiconductor chip. For example, a maximum thickness of the first conversion element measured perpendicular to the emission side is 10 µm to 100 µm. The minimum thickness of the first conversion element, for example, is at least 5 µm.

The first conversion element may comprise a first matrix material and first phosphor particles in the form of quantum dots. The quantum dots may comprise or consist, for example, of a semiconductor material. For example, a geometric equivalent diameter of the quantum dots is not more than 50 nm or not more than 20 nm or not more than 10 nm or not more than 5 nm. Preferably, the equivalent diameter is at least 2 nm. In particular, all phosphor particles in the first conversion element with such a maximum equivalent diameter are referred to as first phosphor particles or quantum dots.

Usually, the geometric shapes of particles of a phosphor deviate from a spherical shape. For example, the particles have an irregular surface and/or are elongated or edged. The geometric equivalent diameter is obtained by determining the diameter of a sphere or circle of the same geometric property as the particle. For example, the particle has a surface or a volume or a projection surface. This surface or volume or projection surface is set equal to the surface or volume or projection surface of a sphere. The diameter of this sphere is the geometric equivalent diameter.

The quantum dots can have an encapsulation that completely surrounds the actual phosphor, for example, the semiconductor material. The encapsulation may comprise or consist of, for example, glass or tetraethyl orthosilicate (TEOS) or vinyltriethoxysilane (VTES).

The first phosphor particles are configured to convert, during operation, the primary radiation and/or other radiation generated in the component partially or completely into radiation of a different wavelength range.

The first phosphor particles can all consist of a single phosphor. Alternatively, the first phosphor particles can also be a mixture of phosphor particles of different phosphors.

The first phosphor particles may be distributed and embedded in the first matrix material. Within manufacturing tolerance, the first phosphor particles are preferably homogeneously distributed in the matrix material. However, the first phosphor particles can also be sedimented in the first matrix material so that a concentration of the first phosphor particles increases towards the emission side. The first matrix material preferably completely surrounds at least some of the first phosphor particles, for example, at least 50% of the first phosphor particles. The first matrix material is preferably used to protect the first phosphor particles.

The first matrix material may be formed by a polysiloxane in which the atomic percentage of carbon is smaller than the atomic percentage of oxygen. The matrix material therefore consists of this polysiloxane. For example, the atomic percentage of carbon in the polysiloxane is at most 80% or at most 50% or at most 30% or at most 10% of the atomic percentage of oxygen. In other words, the polysiloxane selected for the first matrix material is a polysiloxane having such a degree of crosslinking that the atomic percentage of carbon is smaller than the atomic percentage of oxygen. For example, in the polysiloxane, on average each silicon atom is bonded to at least 2.5 or at least three oxygen atoms via a covalent bond. In other words, a majority, i.e., at least 50% or at least 75% or at least 90%, of the siloxane units $R_n SiO_{(4-n)/2}$ in the polysiloxane are tri- or tetrafunctional with n=3 or n=4, where R is an organic rest.

The polysiloxane of the first matrix material can be produced from polysilazane, for example, by hydrolysis and/or oxidation. Possible reaction sequences could be:

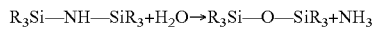

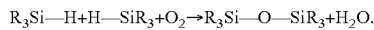

Production from less crosslinked polysiloxane by hydrolysis and/or condensation is also possible. For example, Ti(IV)(OBu)$_4$ can be added as catalyst and/or reactant.

The optoelectronic component may comprise an optoelectronic semiconductor chip that generates primary radiation during intended operation which is coupled out of the semiconductor chip via an emission side of the semiconductor chip. The optoelectronic component may also comprise a first conversion element on the emission side. The first conversion element comprises a first matrix material and first phosphor particles in the form of quantum dots. The first phosphor particles are distributed and embedded in the first matrix material. The first matrix material is formed by a polysiloxane in which the atomic percentage of carbon is smaller than the atomic percentage of oxygen.

Our components are based in particular on the realization that the use of quantum dots in LEDs, especially LEDs in the automotive sector or in flashlights for cameras, has so far only been possible to a limited extent. The quantum dots are particularly sensitive to hydrolysis and temperature. To protect the quantum dots, they are usually embedded in silicone. However, silicone has a relatively high permeability that sooner or later leads to hydrolysis.

We make use of the realization that polysiloxanes with a low carbon content, in particular a lower carbon content than commonly used silicone, have a lower permeability than silicone. This is due in particular to the higher degree of crosslinking of such a polysiloxane compared to silicone. Above all, such a polysiloxane has less simple, easily breakable C—C bonds than silicone.

A further advantage of such a polysiloxane is that its thermal conductivity is greater than that of commonly used silicones. This means that the heat generated during conversion can be better removed.

In summary, such a polysiloxane protects the quantum dots better than commonly used silicones.

The silicon content in the first matrix material may be 20 to 40 atomic percent, preferably 24 to 37 atomic percent.

The carbon content in the first matrix may be at most 10 atomic percent or at most 5 atomic percent or at most 3 atomic percent.

The oxygen content in the first matrix material may be 30 to 70 atomic percent.

The atomic percent values are normalized such that carbon, silicon and oxygen add up to 100 atomic percent. The proportion of hydrogen is therefore not taken into account.

The mass fraction of the first matrix material in the first conversion element may be at least 20% or at least 30% or at least 40%.

The mass fraction of first phosphor particles in the first conversion element may be at least 1% or at least 2% or at least 3%. Alternatively or additionally, the mass fraction may be less than 10% or less than 8%. Preferably, the mass fraction is 2.5% to 6.3%.

The optoelectronic component may comprise second phosphor particles with a geometric equivalent diameter of at least 100 nm or at least 500 nm or at least 1 μm. In particular, all phosphor particles with at least such a geometric equivalent diameter are referred to as second phosphor particles.

The second phosphor particles are configured to partially or completely convert the primary radiation and/or other radiation generated in the component during operation.

The second phosphor particles may have a different emission spectrum than the first phosphor particles. For example, the first and second phosphor particles are configured to convert the primary radiation into light of different spectral ranges.

The second phosphor particles can all consist of a single phosphor. Alternatively, the second phosphor particles can also be a mixture of phosphor particles of different phosphors. The phosphor(s) of the second phosphor particles preferably differ from the phosphor(s) of the first phosphor particles. The second phosphor particles include or consist of, for example, a garnet or nitride or an organic phosphor.

The second phosphor particles may be distributed, in particular homogeneously distributed, and embedded in the first matrix material of the first conversion element. This means that the first conversion element comprises both the first and the second phosphor particles. For example, a mass fraction of the second phosphor particles in the first conversion element is then at least 20% or at least 30% or at least 40%.

The optoelectronic component may comprise a second conversion element. The second conversion element can be applied to the semiconductor chip, especially sprayed on it, independently of the first conversion element. An interface can be formed between the first conversion element and the second conversion element.

The second conversion element can partially or completely cover the emission side. For example, a maximum thickness of the second conversion element, measured perpendicular to the emission side, is 10 µm to 100 µm. The minimum thickness of the second conversion element, for example, is at least 5 µm.

The second conversion element may comprise a second matrix material. The second matrix material is preferably different from the first matrix material. For example, a mass fraction of the second matrix material in the second conversion element is at least 20% or at least 30% or at least 40%.

The second phosphor particles may be distributed, in particular homogeneously distributed, and embedded in the second matrix material. In this example, the first conversion element within the manufacturing tolerance is free of the second phosphor particles. The second conversion element can be free of the first phosphor particles within the manufacturing tolerance. For example, a mass fraction of the second phosphor particles in the second conversion element is at least 20% or at least 30% or at least 40%.

The second matrix material may be formed from a silicone whose atomic percentage of carbon is greater than in the first matrix material. For example, in the second matrix material, the atomic percentage of carbon is greater than the atomic percentage of oxygen. For example, the atomic percentage of oxygen is at most 80% of the atomic percentage of carbon. In the second matrix material, the majority of the siloxane units $R_nSiO_{(4-n)/2}$ in particular are mono- or difunctional with n=1 or n=2.

The first matrix material is preferably a polysiloxane with a higher oxygen content and a lower carbon content than the second matrix material.

The first conversion element and the second conversion element may at least partially cover the emission side, wherein the first conversion element is arranged between the emission side and the second conversion element.

In this example, the quantum dots of the first conversion element are close to the semiconductor chip so that the heat generated by the conversion can be efficiently transported away from the quantum dots.

The first conversion element and the second conversion element may at least partially cover the emission side, wherein the second conversion element is arranged between the emission side and the first conversion element.

In this example, the quantum dots are exposed to little or no primary radiation from the semiconductor chip. For example, the second conversion element partially or completely converts the primary radiation so that the first phosphor particles only need to convert the converted radiation or only a small amount of primary radiation. In particular, if the primary radiation is blue light or UV light, direct irradiation of the quantum dots with this primary radiation can lead to degradation of the quantum dots.

The first phosphor particles may comprise or consist of any of the following materials: CdS, CdSe, ZnS, ZnSe, InP. These materials can form the phosphor of the quantum dots.

Our optoelectronic components are explained in more detail with reference to drawings on the basis of examples. Same reference signs indicate same elements in the individual figures. However, the size ratios involved are not to scale, individual elements may rather be illustrated with an exaggerated size for better understanding.

FIG. 1 shows a first example of an optoelectronic component 100 in cross-sectional view. The optoelectronic component 100 comprises a carrier 3, for example, a ceramic carrier or a metal carrier. An optoelectronic semiconductor chip 1 is arranged on carrier 3. The optoelectronic semiconductor chip 1, for example, electrically connects to carrier 3, for example, via a contact wire (not shown). Laterally, in a direction parallel to a main extension plane of the semiconductor chip 1 or the carrier 3, the semiconductor chip 1 is surrounded with a reflective material 4. The reflective material 4, for example, is a silicone with $TiO_2$ particles embedded in it or a thermoplastic filled with $TiO_2$ or $SiO_2$ such as PPA or PCT.

The semiconductor chip 1, for example, is a GaN-based semiconductor chip that emits electromagnetic primary radiation in the blue spectral range and/or in the UV range when used as intended. For example, during operation, the semiconductor chip 1 emits at least 50% of the radiation decoupled from semiconductor chip 1 via an emission side 10 opposite the carrier 3. The reflective encapsulation 4 laterally around semiconductor chip 1 reduces the proportion of radiation emitted laterally from the component 100.

A first conversion element 21 is applied to the semiconductor chip 1. The first conversion element 21 can, for example, be applied by spraying or dispensing or jetting. The first conversion element 21 comprises a first matrix material 211 in which the first phosphor particles 210 are embedded and distributed. The first phosphor particles 210 are quantum dots, for example, from a semiconductor material. The first matrix material 211 is a polysiloxane in which the atomic percentage of oxygen is greater than the atomic percentage of carbon. In particular, the first matrix material is a highly crosslinked polysiloxane in which a large proportion of the siloxane units are tri- or tetra-functional. Due to the highly crosslinked polysiloxane, the quantum dots are better protected against penetrating moisture than in conventional silicones. The first phosphor particles 210 and the first matrix material 211, for example, account for at least 80% of the mass of the first conversion element 21.

A second conversion element 22 is attached to the first conversion element 21. The second conversion element 22 comprises a second matrix material 221 with second phosphor particles 220 distributed and embedded therein. The second phosphor particles 220 are, for example, garnet- or nitride-based phosphor particles. A geometric equivalent diameter of every second phosphor particle 220, for example, is at least 100 nm.

The second matrix material 221 is a silicone in which the atomic percentage of carbon is greater than that of oxygen. In particular, the majority of the siloxane units in the silicone are mono- or difunctional. The second matrix material is in particular a less strongly crosslinked polysiloxane than the first matrix material.

Due to the composition shown in FIG. 1, the first phosphor particles 210 are arranged close to the semiconductor chip 1 so that the heat generated during the conversion can be quickly removed from the first phosphor particles 210.

For example, the first phosphor particles 210 are configured to convert primary radiation into green and/or yellow light. For example, the second phosphor particles 220 are configured to convert the primary radiation and/or the radiation emitted by the first phosphor particles 210 into red and/or orange light.

Figure 2:
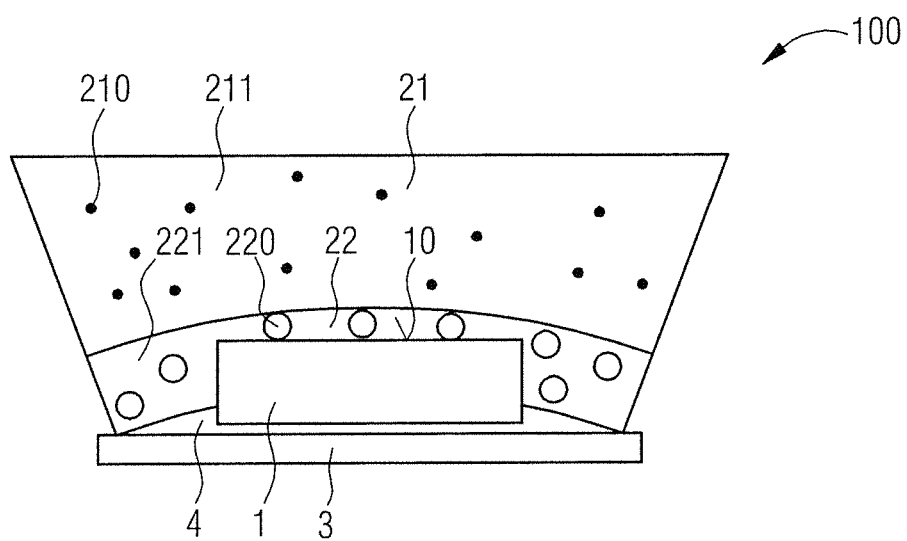

In the second example of FIG. 2, the order of the conversion elements 21, 22 is reversed. The second conversion element 22 with the second matrix material 221 and the second phosphor particles 220 inserted therein is arranged between the first conversion element 21 and the semiconductor chip 1. For example, the second phosphor particles 220 are configured to convert the primary radiation into green and/or yellow light. For example, the first phosphor particles 210 of the first conversion element 21 are configured to convert the primary radiation and/or the radiation emitted by the second phosphor particles 220 into red and/or orange light.

In FIG. 2, the quantum dots 210 are located further away from the semiconductor chip 1, but due to the upstream second conversion element 22, less primary radiation hits the quantum dots 210, which also has a positive effect on their lifetime.

Figure 3:
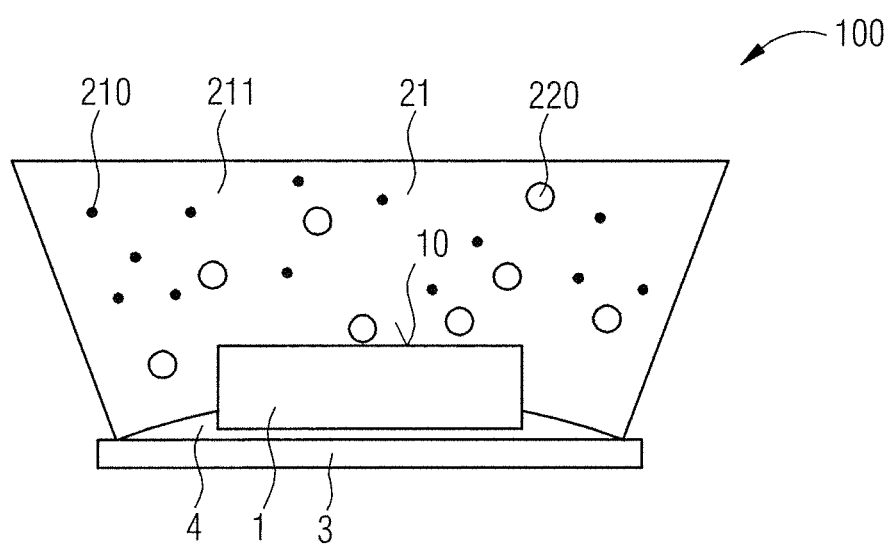

In FIG. 3, only a first conversion element 21 is applied to the semiconductor chip 1. The first phosphor particles 210 and the second phosphor particles 220 are both distributed in the first matrix material 211 of the first conversion element 21, for example, homogeneously distributed.

This application claims priority of DE 10 2018 106 465.9, the subject matter of which is incorporated herein by reference.

Our components are not limited by the description in conjunction with the examples. Rather, this disclosure comprises any new feature as well as any combination of features, particularly including any combination of features in the appended claims, even if feature or combination per se is not explicitly stated in the claims or examples.

The invention claimed is:

1. An optoelectronic component comprising:
   an optoelectronic semiconductor chip that, during intended operation, generates primary radiation coupled out of the semiconductor chip via an emission side of the semiconductor chip; and
   a first conversion element on the emission side,
   wherein
      the first conversion element comprises a first matrix material and first phosphor particles in the form of quantum dots,
      the first phosphor particles are distributed and embedded in the first matrix material,
      the first matrix material is formed by a polysiloxane having such a degree of crosslinking that an atomic percentage of carbon is smaller than an atomic percentage of oxygen,
      a majority of the siloxane units in the polysiloxane are tri- or tetra functional, and
      the mass fraction of the first matrix material in the first conversion element is at least 40%.

2. The optoelectronic component according to claim 1, wherein
   a silicon content in the first matrix material is 20 to 40 atomic percent,
   a carbon content in the first matrix material is at most 10 atomic percent,
   an oxygen content in the first matrix material is 30 to 70 atomic percent, and
   the atomic percentages are normalized such that carbon, silicon and oxygen add up to 100 atomic percent.

3. The optoelectronic component according to claim 1, wherein the mass fraction of first phosphor particles in the first conversion element is at least 20%.

4. The optoelectronic component according to claim 1, further comprising second phosphor particles having a geometric equivalent diameter of at least 100 nm.

5. The optoelectronic component according to claim 4, wherein the second phosphor particles are distributed and embedded in the first matrix material of the first conversion element.

6. The optoelectronic component according to claim 4, further comprising a second conversion element, wherein
   the second conversion element comprises a second matrix material,
   the second phosphor particles are distributed and embedded in the second matrix material, and
   the second matrix material is formed of a silicone whose atomic percentage of carbon is greater than in the first matrix material.

7. The optoelectronic component according to claim 6, wherein the first conversion element and the second conversion element at least partially cover the emission side, and the first conversion element is arranged between the emission side and the second conversion element.

8. The optoelectronic component according to claim 6, wherein the first conversion element and the second conversion element at least partially cover the emission side, and the second conversion element is arranged between the emission side and the first conversion element.

9. The optoelectronic component according to claim 1, wherein the first phosphor particles comprise or consist of any of CdS, CdSe, ZnS, ZnSe and InP.

* * * * *